US009236118B2

(12) United States Patent
Chen et al.

(10) Patent No.: US 9,236,118 B2
(45) Date of Patent: Jan. 12, 2016

(54) NON-VOLATILE RESISTANCE-SWITCHING THIN FILM DEVICES (75) Inventors: I-Wei Chen, Swarthmore, PA (US); Soo Gil Kim, Drexel Hill, PA (US); Albert Chen, Philadelphia, PA (US); Yudi Wang, Drexel Hill, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 239 days.

(21) Appl. No.: 13/060,514

(22) PCT Filed: Dec. 17, 2009

(86) PCT No.: PCT/US2009/068518
§ 371 (c)(1),
(2), (4) Date: Jul. 8, 2011

(87) PCT Pub. No.: WO2010/080512
PCT Pub. Date: Jul. 15, 2010

(65) Prior Publication Data
US 2011/0266512 A1 Nov. 3, 2011

Related U.S. Application Data (60) Provisional application No. 61/139,028, filed on Dec. 19, 2008.

(51) Int. Cl.
*H01L 29/02* (2006.01)
*H01L 47/00* (2006.01)
*G11C 13/00* (2006.01)
*H01L 45/00* (2006.01)

(52) U.S. Cl.
CPC ........ *G11C 13/0002* (2013.01); *G11C 13/0009* (2013.01); *H01L 45/10* (2013.01); *H01L 45/1226* (2013.01); *H01L 45/1233* (2013.01); *H01L 45/14* (2013.01); *G11C 2213/33* (2013.01)

(58) Field of Classification Search
CPC ..................... H01L 45/1233; H01L 29/42332; H01L 45/1625; H01L 21/28282; G11C 11/5614; G11C 11/5678; G11C 13/0002; G11C 13/0004; G11C 13/0009; G11C 13/0011; G11C 2213/33; G11B 7/00454
USPC ........................................................ 257/2–5
See application file for complete search history.

(56) References Cited

U.S. PATENT DOCUMENTS

| 3,886,577 | A | 5/1975 | Buckley |
| 2005/0202204 | A1 | 9/2005 | Nishihara et al. |
| 2006/0081911 | A1* | 4/2006 | Batra et al. ..................... 257/315 |
| 2006/0189084 | A1 | 8/2006 | Mizuguchi et al. |
| 2007/0269683 | A1 | 11/2007 | Chen |
| 2008/0224229 | A1 | 9/2008 | Tajima et al. |

OTHER PUBLICATIONS

Polymer Morphology.*

* cited by examiner

*Primary Examiner* — Jay C Kim
*Assistant Examiner* — David Chen
(74) *Attorney, Agent, or Firm* — Baker & Hostetler LLP (57) ABSTRACT

Disclosed herein is a resistive switching device having an amorphous layer comprised of an insulating silicon-containing material and a conducting material. The amorphous layer may be disposed between two or more electrodes and be capable of switching between at least two resistance states. Circuits and memory devices including resistive switching devices are also disclosed, and a composition of matter involving an insulating silicon-containing material and a conducting material comprising between 5 and 40 percent by molar percentage of the composition is disclosed herein as well. Also disclosed herein are methods for switching the resistance of an amorphous material.

45 Claims, 9 Drawing Sheets

→ No Pt peaks detected in mixture films

Insulating    FIG. 7(a)

Conducting

FIG. 10

NON-VOLATILE RESISTANCE-SWITCHING THIN FILM DEVICES

CROSS-REFERENCE TO RELATED APPLICATIONS

This application is the National Stage of International Application No. PCT/US2009/068518, filed Dec. 17, 2009, which claims the benefit of U.S. Provisional Application No. 61/139,028, filed Dec. 19, 2008, the disclosures of which are incorporated herein by reference in their entireties for all purposes.

STATEMENT OF GOVERNMENT INTERESTS

At least a portion of the work leading to the disclosed inventions was made using federal support by the National Science Foundation under grants number DMR07-05054 and DMR-05-20020. Accordingly, the U.S. government may have rights to the disclosed inventions.

TECHNICAL FIELD

The disclosed inventions generally relate to semiconductor devices, and more particularly to resistance-switching semiconductor devices. The disclosed inventions also generally relate to resistance-switching material compositions.

BACKGROUND

Resistance-switching behavior is well known in the art and has been observed and studied in some metal-insulator mixtures since the mid 1970's. Reversible resistance-switching devices are currently one of the main contenders for replacing flash memory devices in future non-volatile memory applications. Such future non-volatile memory devices need to be increasingly scalable (to length scales lower than about 22 nanometer ("nm")), at low energy operation and fabrication cost, and exhibit complementary metal-oxide-semiconductor ("CMOS") process compatibility.

Some resistance-switching technologies may be triggered by voltage, a phenomenon called Electrical Pulse Induced Resistance ("EPIR") switching effect. EPIR semiconductor devices are disclosed in U.S. Pat. No. 3,886,577 (Buckley). In the Buckley devices, a sufficiently high first voltage (50V) is generally applied to a semiconductor thin film in which an approximately 10 micron portion, or filament, of the film is set to a low resistivity state. The device is then typically reset to a high resistance state by the action of a second high voltage pulse. However, the number of switching cycles performed strongly affects set voltage. Thus, these devices generally exhibit high power consumption and poor cycle fatigue performance.

Other efforts in the art have investigated ferroelectric and magnetoresistive materials for non-volatile memory applications. These materials, however, tend to suffer from cycle fatigue and retention problems. Moreover, many magnetoresistive oxide devices require magnetic switching fields and require low operating temperatures.

Application of an electrical stimulus in a magnetic field to some perovskite family thin films shows useful resistive switching properties. Early efforts with perovskite materials required relatively high voltages and the EPIR effect tends to be cycle dependant. Later advances in these materials were able to create two terminal devices with two stable states with lower power consumption. However, the devices made from perovskite materials are largely incompatible with the semiconductor industry due to their crystal structures and the difficulties in manufacturing these materials on silicon substrates.

Metal oxides and other perovskite like materials have also been proposed for resistive switching memory devices. These metal oxide devices, however, suffer from incompatibility with silicon based semiconductor industry, and may also suffer from a lack of scalability.

Further, many of the aforementioned techniques and devices have not shown scalability for future devices, such as those expected to be in the 22 nm range for the year 2016.

Thus there has been a long-standing need for CMOS compatible nanoscale non-volatile resistance-switching devices that exhibit low power consumption and can be manufactured at low temperature using currently available silicon based semiconductor industry techniques.

SUMMARY OF THE INVENTION

In overcoming the challenges associated with non-volatile resistance-switching devices, the present invention provides, inter alia resistive devices comprising at least one amorphous layer, the amorphous layer comprising a composition of an electrically conducting composition, and an electrically insulating silicon-containing composition. The electrically conducting composition of the amorphous layer comprises from about 5 percent to about 40 percent by molar percentage of the amorphous layer, and at least two electrodes in electrical contact with the amorphous layer.

Also provided are circuits comprising a plurality of resistive devices, each of which comprises at least one amorphous layer, the amorphous layer comprising a composition of an electrically conducting composition, and an electrically insulating silicon-containing composition. The electrically conducting composition of the amorphous layer comprises from about 5 percent to about 40 percent by molar percentage of the amorphous layer, and at least two electrodes in electrical contact with the amorphous layer.

Also provided for are compositions of matter comprising an amorphous composition of an electrically conducting composition and an electrically insulating silicon-containing composition. The electrically conducting composition comprises from about 5 percent to about 40 percent by molar percentage of the amorphous composition. The electrically conducting composition comprises Pt, Pd, Ni, W, Au, Ag, Cu, Al, Rh, Re, Ir, Os, Ru, Nb, a conducting metal nitride, a conducting metal silicide or any combination thereof. The electrically insulating silicon-containing composition comprises silicon oxide, silicon nitride, silicon oxy-nitride, or any combination thereof.

Also provided are memory devices comprising at least one amorphous layer, the amorphous layer comprising a composition of an electrically conducting composition, and an electrically insulating silicon-containing composition. The electrically conducting composition of the amorphous layer comprises from about 5 percent to about 40 percent by molar percentage of the amorphous layer, and at least two electrodes in electrical contact with the amorphous layer.

Also provided are methods for switching a resistive device comprising providing at least one amorphous layer, the amorphous layer comprising a composition of an electrically conducting composition, and an electrically insulating silicon-containing composition. The electrically conducting composition of the amorphous layer comprises from about 5 percent to about 40 percent by molar percentage of the amorphous layer, and at least two electrodes in electrical contact with the amorphous layer, and providing a set voltage or current to the amorphous layer.

Non-volatile resistive switching devices present a class of materials capable of operation as stable, non-volatile resistance switches in the nanoscale range that may be used in various non-volatile memory applications such as a switch or a logic device. The general structure of the device is a layered thin film set between at least two electrodes and capable of switching between two resistance states, one state having a relatively larger resistance compared to a second state.

An electrically conducting electrode may be deposited on a silicon substrate. A thin film of an insulating silicon based material and a conducting material are co-deposited on the electrode to create an amorphous resistance-switching layer. The concentration of the conducting layer should be sufficiently high, however, such that below certain thicknesses, the film is conducting along the thickness direction due to the existence of short conducting paths. A second electrode is deposited on top of the substrate to create a two terminal resistance-switching device. These electrodes may deliver a current or voltage to the amorphous resistance-switching layer.

The electrodes may deliver a voltage known as the set voltage to the amorphous resistance-switching layer, which switches the device from a first resistance state to a second resistance state. The device may stay in the second resistance state until the application of a set voltage of an opposite polarity, which switches the device from the second resistance state back to the first resistance state. The device may stay in the first resistance state until another application of the set voltage. The set voltage to switch a resistance-switching layer from a first resistance state to a second resistance state may be different from the set voltage to switch a resistance-switching layer from the second resistance state to the first resistance state.

In another embodiment, setting or resetting of the resistance state of a device may be performed using other methods, such as, for example, UV reset. The device may first be switched from a first resistance state to a second resistance using a set voltage, and then returned to the first resistance state by irradiating the device with UV radiation. In another embodiment, switching voltages may not be required at all, and all switching may be performed by irradiating the device with UV radiation.

The electrodes may also deliver a "read voltage" to the device, which voltage's absolute value is smaller than the absolute value of any of the set voltages. This read voltage may be used to read the resistance state of the amorphous resistance-switching layer without altering the resistance state of the device.

The device above may be non-volatile and thus does not require the continuous application of either voltage or current to maintain resistance states. It is also desirable that the device be capable of switching between a low and high resistance state repeatedly without a loss of switching time or stability.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 9 (a-b) depict the dependence of high resistance value (HR), low resistance value (LR), set voltage Vset and yield on the thickness of a bottom Mo electrode.

DETAILED DESCRIPTION OF ILLUSTRATIVE EMBODIMENTS

As used herein, "resistance-switching" means a material capable of switching between at least two resistance states, a first resistance state having a relatively lower resistance than a second resistance state. Application of a first set voltage to a resistance-switching material may switch the material from a first resistance state to a second resistance state. Application of a second set voltage to a resistance-switching material may switch the material from a second resistance state back to the first resistance state.

As used herein, "amorphous" means a material wherein an X-ray diffraction test of the amorphous layer does not exhibit crystalline peaks of the as-deposited layer. Generally, this means that there is less than about 5 percent by weight of the amorphous layer of crystallites. Preferably there is less than about 4 percent by weight, or even less than about 3 percent by weight, or even less than 2 percent by weight, or even less than 1 percent by weight, of the amorphous layer of crystallites.

As used herein, "electrode" means a conducting material electrically contacted with the resistance-switching material. Electrodes may be comprised of a conducting material, a semiconducting material, or any combination thereof. As used in electrodes, conducting materials include all noble metals, all transition metals, all conduction transition metal nitrides and carbides, all conducting metal silicides, all p-type or n-type doped silicon and other semiconductors, all conducting oxides including those that are transparent to visible light, all organic conducting materials, any other conducting materials and any combinations thereof As used herein, "set voltage" means the voltage required for switching the resistance state of a resistance-switching layer from its current state to a second state. As used herein, "set voltage" and "set current" are used interchangeably. The set voltage may imply more than one voltage, for example, the set voltage to switch a resistance switching layer from a first resistance state to a second resistance state may be different from the set voltage to switch a resistance-switching layer from the second resistance state to the first resistance state.

As used herein, "read voltage" means a voltage, typically less in absolute value than the set voltage that may be applied to a resistance-switching material for purposes of determining the resistance of the resistance-switching material without switching the resistance state of the material. The voltage may be used to determine whether the resistance-switching layer is in a first resistance state or a second resistance state. As used herein, "read voltage" is used interchangeably with "read current".

As used herein, "amorphous resistance-switching layer" means one or more amorphous layers of insulating silicon-containing material and electrically conducting material; the electrically conducting composition comprising from about 5 percent to about 40 percent by molar percentage of the material or from about 6 percent to about 35 percent by molar percentage of the material, or from about 7 percent to about 30 percent by molar percentage of the material, or even from about 8 percent to about 25 percent by molar percentage of the material and, in electrical contact with the amorphous layer, at least two electrodes, the one or more amorphous layers adding to a combined thickness of between about 4 nm and about 60 nm, or from about 5 nm to about 50 nm, or from about 6 nm to about 45 nm, or from about 7 nm to about 35 nm or even from about 8 nm to about 30 nm as measured between one or more pairs of electrodes. The amorphous layer is capable of switching between at least two resistive states, a first resistive state having a resistance greater than at least one second resistance state.

As used herein, molar percentage means a percentage calculated by multiplying (% M+% Me)/(% Si+% M+% Me) by 100, wherein a metal is denoted as M, a metal nitride is denoted as (Me)Nx, wherein Me is a nominally a metallic element such as, but not limited to, Ti in TiN, a metal silicide is denoted as (Me)Six, where Me is again a nominally metallic element such as, but not limited to, Co in CoSi2. Silicon is denoted as Si, e.g., the silicon in a silicon oxide, silicon nitride or silicon oxy-nitride, denoted as $SiO_xN_y$, such as, but not limited to, $SiO_2$ and $SiN_{4/3}$. As used herein, "% a" refers to percent a, and a can be M, Me, Si. As used in (Me)Nx, (Me)Siy, and SiOwNz, x is in the range of from about 0.5 to about 3, y is in the range of about 0.5 to about 3, w is in the range of from about 0 to about 2, and z is in the range of from about 0 to about 4/3.

As used herein, "insulating silicon-containing material" means any silicon oxide, any silicon nitride or any silicon oxy-nitride, a B or P doped silicon oxide, or any combination thereof.

As used herein, an "electrically conducting material" in the "resistance-switching layer" means any material commonly known in the art as a conducting material such as Pt, Pd, Ni, W, Au, Ag, Cu, Al, Rh, Re, Ir, Os, Ru, Nb, a conducting metal nitride, a conducting metal silicide, or any combination thereof. A conducting metal silicide may include $PtSi_2$, $TiSi_2$, $CoSi_2$, $NiSi_2$, $NbSi_2$, $TaSi_2$, $MoSi_2$, $WSi_2$, or any combination thereof. A conducting metal nitride may include TiN, ZrN, HfN, NbN, TaN, or any combination thereof.

As used herein, "non-volatile operation" means that the resistance-switching layer, when switched from a first state to a second state, or from a second state to a first state, remains in about the same resistance state without the continuous application of voltage or current.

As used herein, "circuit" means one or more circuit devices such as a resistive device, a capacitance device, a field effect transistor device, or any combination thereof configured to perform any function of such devices known in the art. For example, these devices may be used in a memory application.

Figure 1:
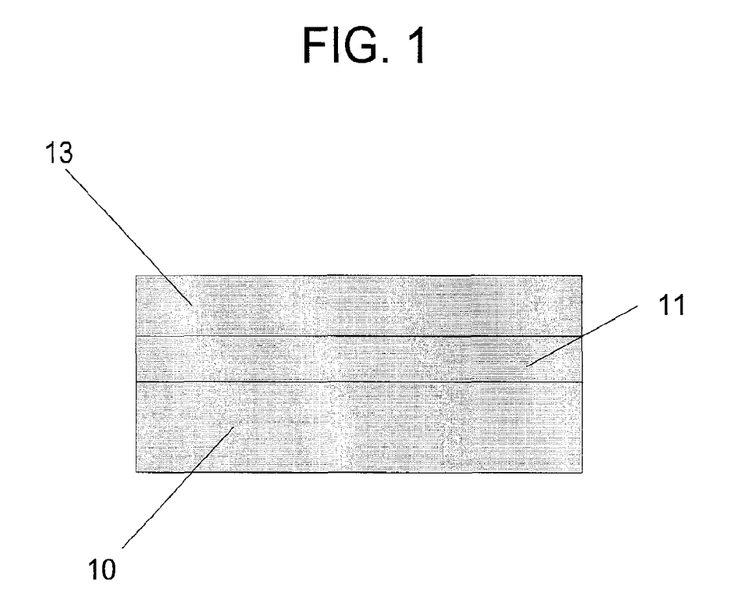
FIG. 1 depicts an embodiment of a resistive switching device according to certain embodiments of the present invention.

FIG. 1 illustrates one possible geometry of a layered two terminal resistance-switching device, wherein an amorphous resistance-switching layer 11 is deposited between two electrodes 10, 13. The amorphous layer 11 may be switched between two different resistance states. These resistance states are set by applying a current or voltage via the electrodes 10 and 13. The current or voltage used for setting the resistance state is called the "set current" or "set voltage" of the device. The resistance of the amorphous layer is read by the application of a current or voltage that is lower than the set current or voltage. This lower current or voltage is the "read current" or "read voltage". The read current or read voltage may not affect the resistance state of the device.

Figure 2:
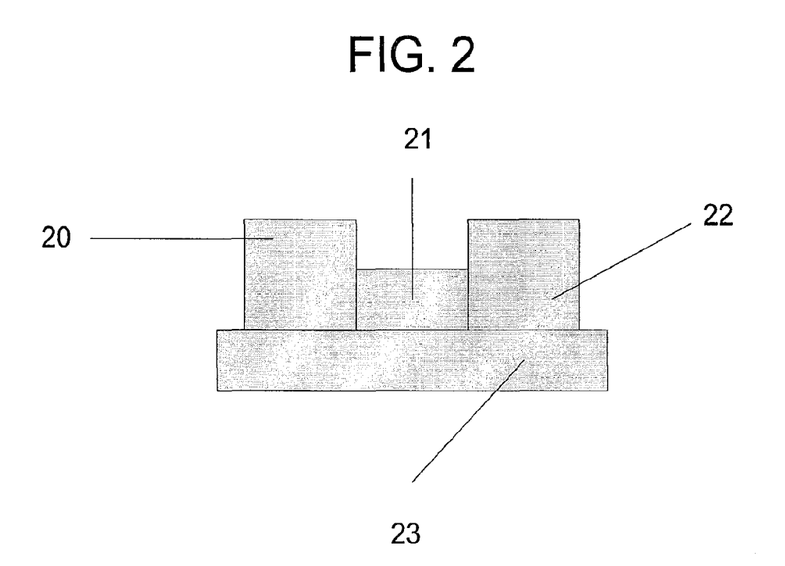
FIG. 2 depicts an embodiment of a resistive switching device according to certain embodiments of the present invention.

FIG. 2 illustrates another possible geometry of a two terminal resistance-switching device, wherein an amorphous resistance-switching layer 21 is deposited on a silicon substrate 23 between two electrodes 20, 22 that are also deposited on the substrate 23. The amorphous layer 21 may be switched between two different resistance states. These resistance states may be set by applying a set current or voltage via the electrodes 20 and 22. The resistance of the amorphous layer is read by the application of a read current or voltage via electrodes 20 and 22, where the absolute value of the read current is lower than the set current or voltage. The read current or voltage may not affect the resistance state of the device. The geometries depicted in FIGS. 1 and 2 do not limit the possible geometries for these devices but merely provide useful examples of possible geometries.

The geometry of the switching layer as used herein may be a rectangle, square, ribbon, tube, rod, cylinder, hemisphere, dot, sphere, trapezoid or any other shape compatible with the one or more layers set between at least one pair of electrodes. The geometry of the electrodes includes any shape that is compatible with electrically contacting the resistance-switching layer. These electrodes may be circular, rectangular, cylindrical, square, straight, curved, hemispheric or any other suitable geometry.

Figure 4:
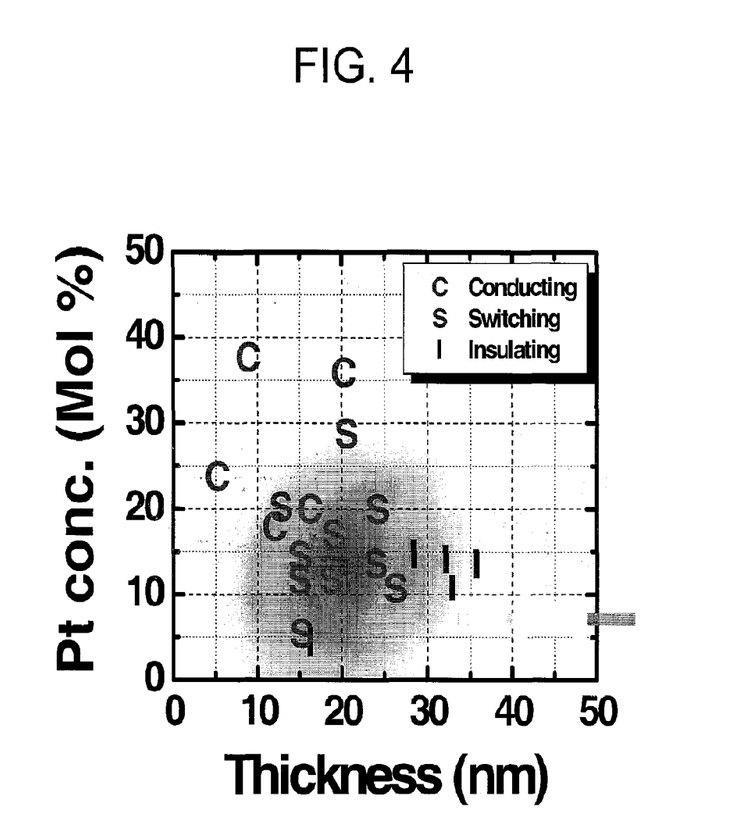
FIG. 4 shows the electrical switching behavior of $SiO_2$—Pt as a function of thickness and Pt concentration.

FIG. 4 is a graphical display showing the relationship between conducting material and insulating material in a resistance-switching device in an amorphous layer of Pt mixed with $SiO_2$. Using the materials selected for FIG. 4, composition of the amorphous layer determines if the device may act as a switch, an insulator only or a conductor only. In general the percentage of the electrically conducting composition necessary to exhibit resistance-switching behavior increases with the thickness of the amorphous layer, with a different proportionality for different electrically conducting composition and different electrically insulating composition. For a sample device, the relationship between thickness and switching may be seen in FIG. 6.

The total thickness of the one or more amorphous resistance-switching layers may be in the range of from about 4 nm and 60 nm, or of from about 5 nm to about 50 nm, or of from about 6 nm to about 45 nm, or even of from about 7 nm to about 35 nm as measured as the distance between the at least one pair of electrodes. The total thickness of these resistance-switching layers is the distance between two electrically conducting electrodes, wherein the electrodes may be aligned opposite each other, next to each other on a surface, or offset either across or next to each other.

Figure 3:
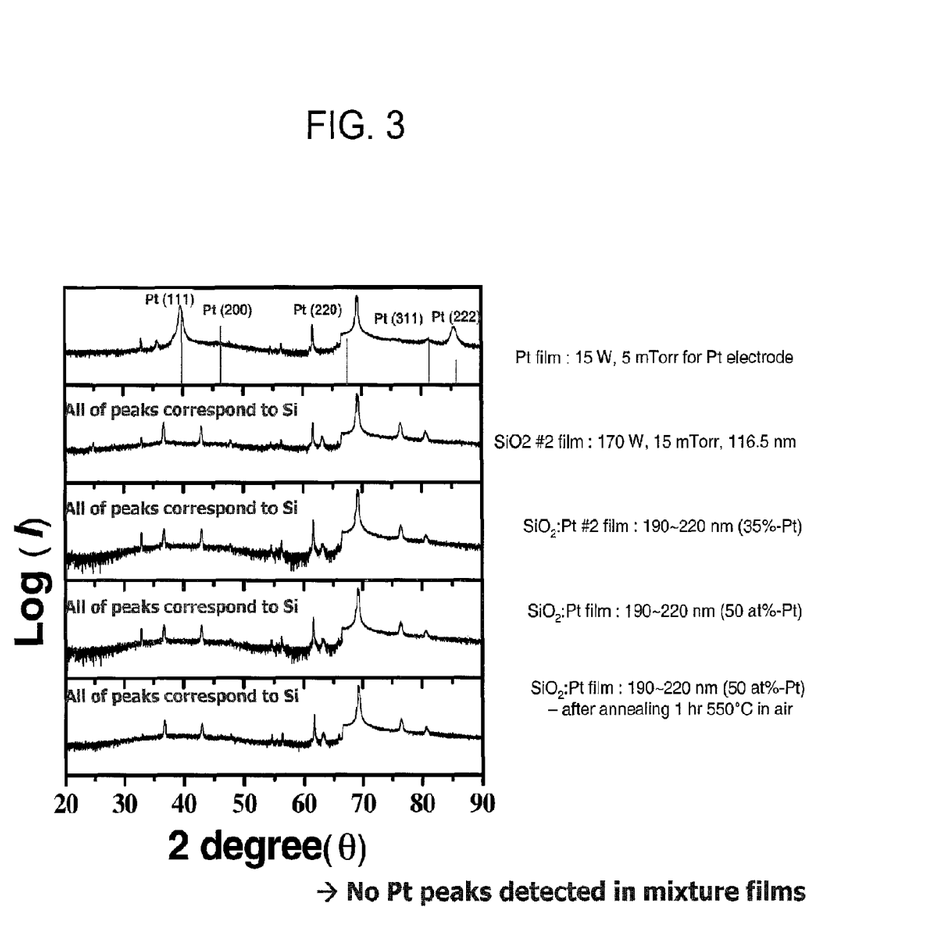
FIG. 3 shows X-ray diffraction patterns of crystalline Pt and amorphous $SiO_2$—Pt layers.

FIG. 3 depicts X-ray diffraction patterns of a crystalline Pt film deposited on a silicon substrate, an amorphous $SiO_2$ film deposited on a silicon substrate and three amorphous $SiO_2$— Pt mixture films deposited on silicon substrates. These X-ray diffraction patterns indicate that the mixture layer is amorphous for the reason that there appears to be no X-ray diffraction peaks arising from crystalline Pt film. Generally, an X-ray diffraction pattern lacking diffraction peaks is evidence of fewer than 5 percent crystallites by weight of the material.

Figure 7A:
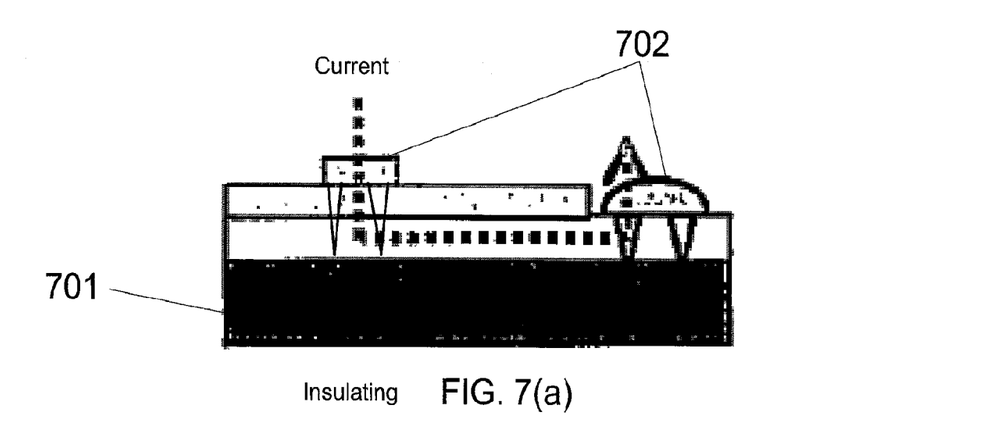
FIGS. 7(a)-(b) depict a change in a conducting path of one embodiment of the present invention when the layer evolves from a state of high resistance-switching to a state of low resistance-switching.
Figure 7B:
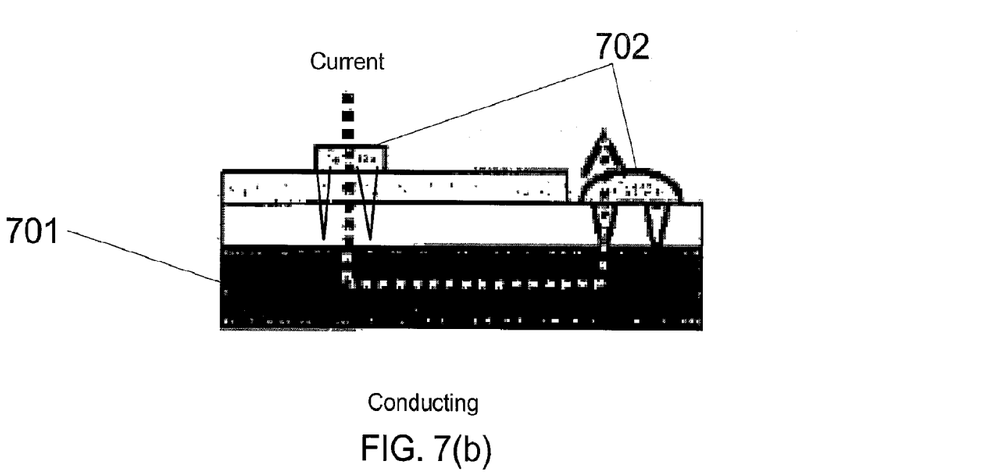

FIGS. 7(a)-(b) depict an embodiment of an amorphous resistance switching device similar to the geometry depicted in FIG. 2, where the conduction path between two lateral electrodes 702 changes. The layer 701 evolves from a state of high resistance-switching to a state of low resistance-switching causing a change in the conduction path of the device.

Figure 10:
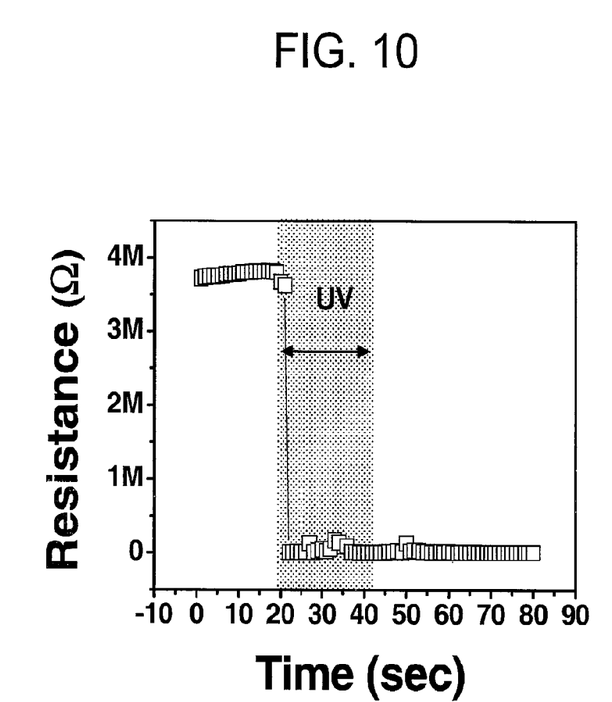
FIG. 10 depicts the change from the high resistance state to the low resistance state triggered by UV irradiation.

As shown in FIG. 10, irradiating a resistance switching device may cause the device to switch from a first state of resistance to a second state of resistance. Accordingly, devices may be fabricated that do not require switching voltages at all. As another example, devices may be fabricated that only require a switching voltage to switch the device from a first state to a second state, but not from a second state to a first state. Such devices may have faster overall switching speed.

An amorphous layer comprised of one or more conductive materials and insulating silicon-containing materials is described herein. A certain embodiment of the present invention utilizes co-sputtering techniques to obtain the amorphous layer of an insulating silicon-containing material and one or more conducting materials. Other suitable techniques for preparing amorphous layers include, without limitation, direct-current sputtering, radio-frequency sputtering, pulsed laser deposition, physical vapor deposition, atomic layer deposition, chemical vapor deposition, ion-assisted deposition, wet chemistry, co-evaporation techniques and any other method, present or future for constructing a amorphous resistance-switching layer. The conducting composition may also be deposited into an amorphous layer by ion implantation or any other method of introduction.

As in FIG. 1, certain embodiments of the present invention may have at least one pair of electrodes situated as a top and bottom electrode. Devices may also include a substrate, a first electrode layer disposed on the substrate, at least one amorphous resistance-switching layer as described herein disposed on the first electrode, and a second electrode layer disposed on the amorphous layer. The first and second electrode layers may respectively serve as bottom and top electrodes. In this regard, at least one of the electrodes may also comprise a conductive material.

These electrodes may be grown or deposited in any manner known in the art present or future capable of disposing electrodes on thin films. Resistance switches may also have at least one pair of electrodes configured in any other geometry suitable for electrically contacting the resistance-switching layer. It is desirable that the electrodes be selected based on the composition of the mixture layer. Without being bound by any particular theory of operation, the desired compositions of the mixture layers take into consideration the class of electrically insulating compositions (e.g., oxides, nitrides or oxynitrides), the class of electrically conducting compositions (e.g., metals, metal nitrides or metal silicides), the work function of the electrically conducting compositions, and the electron affinity of the electrically insulating compositions.

Suitable substrates may be any material that is compatible with the CMOS industry, such as silicon (Si). In other embodiments, the Si substrate may be doped as either an n-type or as a p-type Si. Other substrates such as sapphire, glass, ceramics and polymers may also be used.

Devices may be particularly suited for random access memory and other memory applications. For example, simple two terminal resistance-switching devices may be produced to read and write binary information. Thus, the application of a first set voltage would set the device to a first resistance state. The application of a second set voltage would set the device to a second resistance state. In this manner, information may be written to the device upon application of a voltage having the appropriate magnitude and polarity. The device may be read by applying a smaller read voltage to the device through the same electrodes. A resistance-switching memory device may be non-volatile in its operation.

Circuits having one or more resistance-switching devices are also included in a sample embodiment. Each resistance-switching device may have an amorphous layer as described above between two electrodes as described above. Circuits having resistance-switching devices may also include, for example other circuit elements such as resistive devices, capacitive devices, field effect transistor devices, or any other electronic elements known in the art. Such circuits may be used for any purpose known in the art.

Proposed Theoretical Switching Mechanism

Without being bound by any particular theory of operation of the disclosed devices, a tentative picture of the switching mechanism in the amorphous layer is herein described. Initially, in the as-fabricated state, some of the connected conducting paths due to the overlap of the electron wave functions of conductive material go through the film thickness and provide the metallic conduction. The energy levels of the conductive material are aligned around the Fermi level of the two electrodes with a narrow bandwidth (B), which is narrow because the overlap of wave function is weak and not extending to many atoms of the conductive composition. This is the low resistance state. When a high enough positive bias is applied, a few electrons are trapped at some sites.

Without being bound by any particular theory of operation, it is believed that to trap electrons in the conductive material sites, the electrons usually will need to overcome an energy barrier between the conducting paths and the trap sites. The size of this energy barrier depends on the energy level difference between the conduction band of the silicon-containing insulator and the conductive material. Thus, the switching voltage is dependent on the same barrier. In a device where a lower electrode has an energy barrier between the electrode and the silicon-containing insulator that is lower than the energy barrier between the top electrode and the silicon-containing insulator, the set voltage should be positive, referring to the bias that causes electrons flowing from bottom to top, or electrical current from top to bottom. This configuration favors trapping when the electrons flow from the electrode with a lower energy barrier. In practice, if the work function of the top electrode is higher than that of the bottom electrode, the set voltage is positive, switching the state of lower resistance to the state of higher resistance. Conversely, if the work function of the bottom electrode is higher than that of the top electrode, the set voltage is negative.

The reset voltage should be lower than the set voltage because the trapped electron at the sites occupies a higher energy state due to localization, making it easier to tunnel back to the bottom electrode, requiring lower voltage. In this way, the isolated paths with trapped electrons appear to work like a floating gate that regulates the conduction on the remaining metallic paths. The trapped electrons are isolated from the electrodes by the insulating barrier which makes it difficult for them to leak out, thus providing the non-volatile character of the memory.

The trapped electrons are believed to raise the energy level of the site to the next available state. The trapping event also increases the energy of the nearby conductive material sites due to the electrostatic interaction energy, acting as an isolated floating gate that prevents the electron from passing through the nearby region. This spreads out the originally aligned energy levels of the conductive material sites to a characteristic distribution width (W). If the aligned energy level width W is larger than the bandwidth B, the electron wave at each site becomes localized as in the case of Anderson localization in amorphous solids.

In order to pass a current under these conditions, the electrons then need to hop from the localized state in one site to the localized state in another. The resistance of the mixture increases due to this variable range hopping. Under these conditions, the device is in a high resistance state.

Upon the application of a large enough negative bias, these trapped electrons hop from the trapping sites, lowering the energy level dispersion width W until it is less than the bandwidth B. Under this condition, the material regains its initial conductive property and returns to the low resistance state.

EXAMPLES

An example of a resistance-switching memory device is described using single crystal silicon n-type or p-type silicon with 100 or 110 orientations as the substrate, $SrRuO_3$ as the bottom electrode, Pt as the top electrode, and $SiO_2$/Pt as the amorphous mixture layer. The various materials above do not share a common structure, and indeed the mixture layer can be deposited on unheated substrates. The test cells in the current example device had a diameter of 80 microns ("μm").

The bottom electrode was deposited by pulse laser deposition using a KrF laser with laser energy of 200 mJ at a repetition frequency of 1-15 Hz in an $O_2$ pressure of 0.01-100 mTorr. The film thickness, orientation and crystallinity were determined by a theta-2 theta diffractometer and a four circle x-ray diffractometer, both using a Cu Kα source. The surface morphology was observed by atomic force microscopy.

Because the silicon substrate may be covered by a layer of native oxide of an amorphous nature, the bottom electrode was deposited onto an effectively amorphous substrate, therefore the bottom electrode layer is polycrystalline, with a grain size that depended on the deposition condition and the film thickness.

RF-sputtering was used to deposit the amorphous $SiO_2$—Pt layer and the Pt top electrode, the latter through a shadow mask. Electrical properties were measured using several electrical meters on a Signatone S-1160 probe station. Although the Pt electrode film is crystalline as evidenced by peaks identifiable with various Pt reflections from an X-ray diffraction pattern, none of the peaks were seen in the amorphous resistance-switching layer.

The above heterostructure thin film device shows excellent resistance-switching between an initial low-resistance and a set high-resistance. The set voltage is around +4.1 V and the reset voltage is around −2.5 V. The on/off ratio of resistance in the test devices typically exceeded 100:1. The device was tested for 1000 hours at 150° C. and showed little change in memory of either high or low resistance, exhibited fast switching speed of ~25 ns throughout the testing as well as good fatigue resistance.

Figure 5:
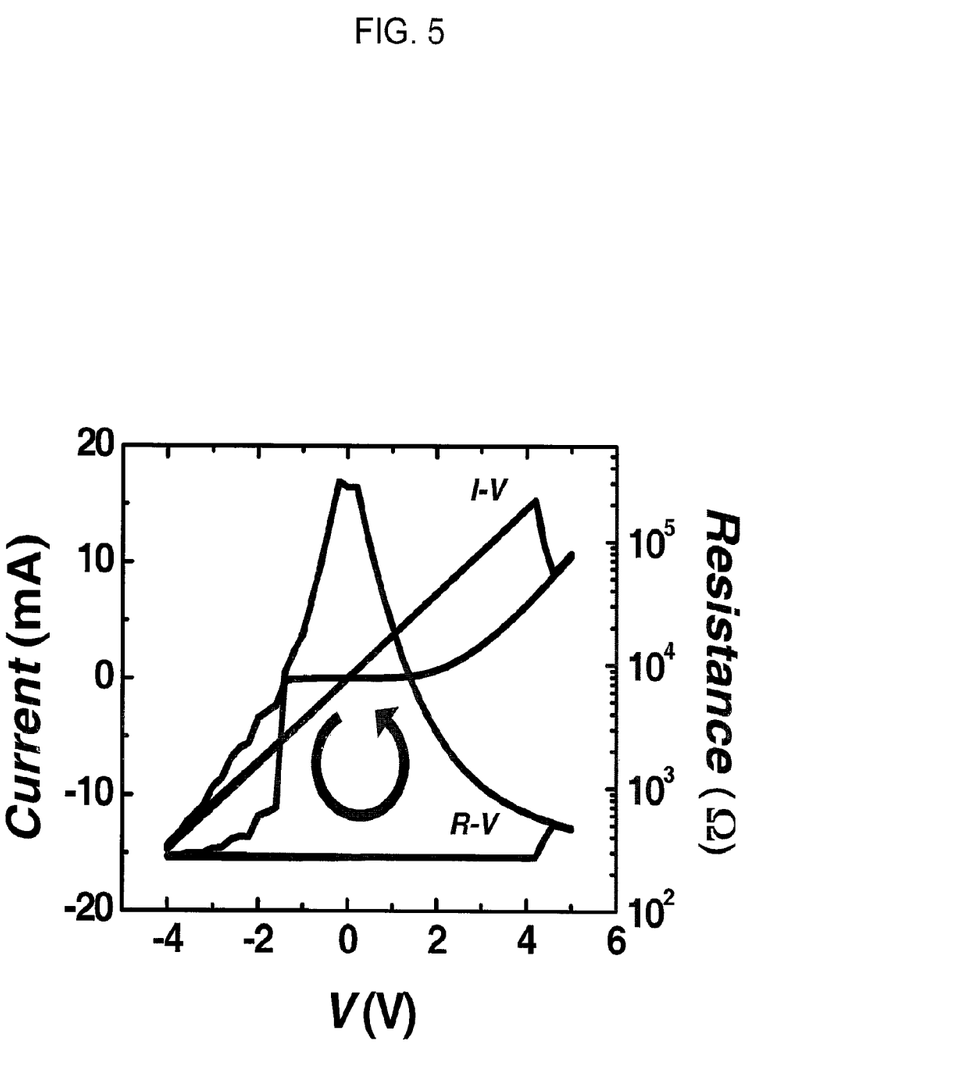
FIG. 5 shows the typical I-V and R-V curves of one embodiment of the present invention using an amorphous $SiO_2$—Pt mixture.
Figure 6A:
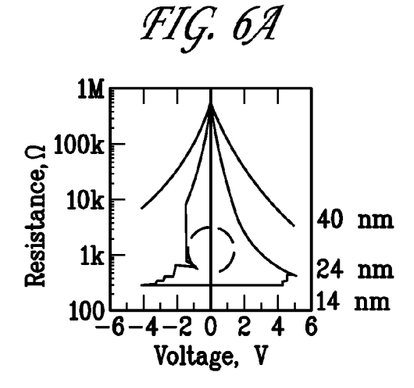
FIGS. 6(a)-6(d) show the dependence of electrical characteristics on thickness for one embodiment of the current invention, where the embodiment is a $SiO_2$—Pt layer having a mole percentage of the amorphous layer of about 18 percent of the total layer percentage.
Figure 6B:
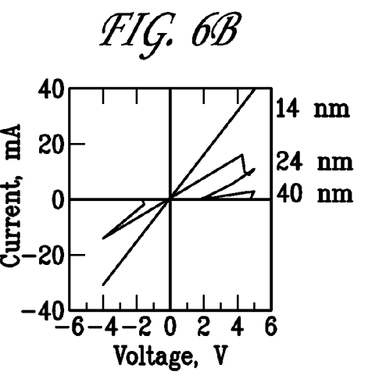
Figure 6C:
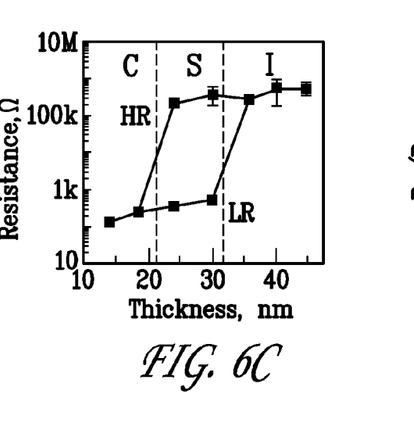
Figure 6D:
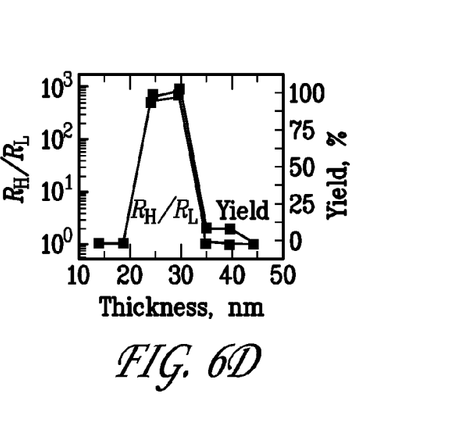

Current-voltage (I-V) curves were measured in both continuous and pulsed voltage-sweep modes. As used in the following tests, positive bias is the one causing a current to flow from the Pt electrode to the $SrRuO_3$ electrode. A typical room temperature I-V curve of a device with an amorphous resistance-switching layer of Pt/$SiO_2$—Pt/$SrRuO_3$ is shown in FIG. 5 for a voltage sweep of 0 V to −4 V to 0 V to 5 V to 0 V to −4 V to 0 V. The I-V curve was recorded in the voltage-control mode and was the same for both the continuous and the pulsed mode. The resistance defined as the ratio of V/I is also plotted along with a schematic circle indicating the rotational direction of the hysteresis. The mixture shows a low initial resistance 300 Ω and this low resistance state is stable under a negative bias. Under a positive bias, it is still stable below 4 V, but the resistance suddenly increases to a larger value, ~350 kΩ when the bias exceeded 4 V. The high resistance state is kept until a negative bias of about −1.5 to −2.5 V is applied, which switches the resistance back to the low resistance state. This switching behavior between two stable states demonstrates a pronounced memory effect, with a set voltage of from about 4 to about 4.5 volts and a reset voltage of from about −1.5 to −2.5 V. The device also allowed a read voltage between −1 V and +1 V without disturbing the high and low resistance states.

Breakdown voltage was measured by increasing the negative bias until the cell broke down, which occurred at about 8 V and was usually accompanied by some evidence of physical damage such as bursting of an electrode. All the samples tested were in the low resistance state when they reached a sufficiently large negative voltage before breakdown. Under a positive bias, switching to the high resistance state occurred first at about 4 V, and the breakdown occurred at about 14 V.

The voltage pulse required to switch the device was measured using repeated pulses of a certain pulse width, with the magnitude of their pulse voltage systematically increased until switching was complete. After each pulse, the resistance was measured at a fixed low voltage of about 0.2 V to determine whether switching had occurred or not. The process was next repeated using pulses of different widths. Switching generally happens abruptly and in one pulse, after which the new resistance is stable until reverse switching occurs upon the application of a pulse of an opposite polarity at a certain voltage. The switching voltages are generally consistent unless the pulse widths is less than about 75 nanoseconds ("ns"), and pulses of less than about 75 ns may require higher voltages. Although switching voltage may depend on pulse width, the low and high resistance states may be independent of pulse width.

The resistance states can be kept in a non volatile manner as verified by certain retention experiments. The devices stored in air for several months experienced no memory lapse. To perform accelerated retention tests, two different cells on the same substrate were first switched to a resistance state using a probe station. Then the sample was disconnected and placed in an oven at 150° C. The sample was removed from the oven after a certain period, reconnected to the probe station, and read using a read voltage. This process was repeated for up to 1000 hr of cumulative heating time. The extrapolated decay of resistance values of high resistance state and low resistance state should, after about 10 years maintain a resistance ratio of about 25. Generally, there may be no need for an electrical source to maintain the resistance states.

Fatigue tests were also run. Samples were repeatedly cycled between the low resistance and high resistance states using 1 μs pulses of 5.6 V and −3.8 V. Little or no wear of the resistance was seen after repeated switching.

Figure 8:
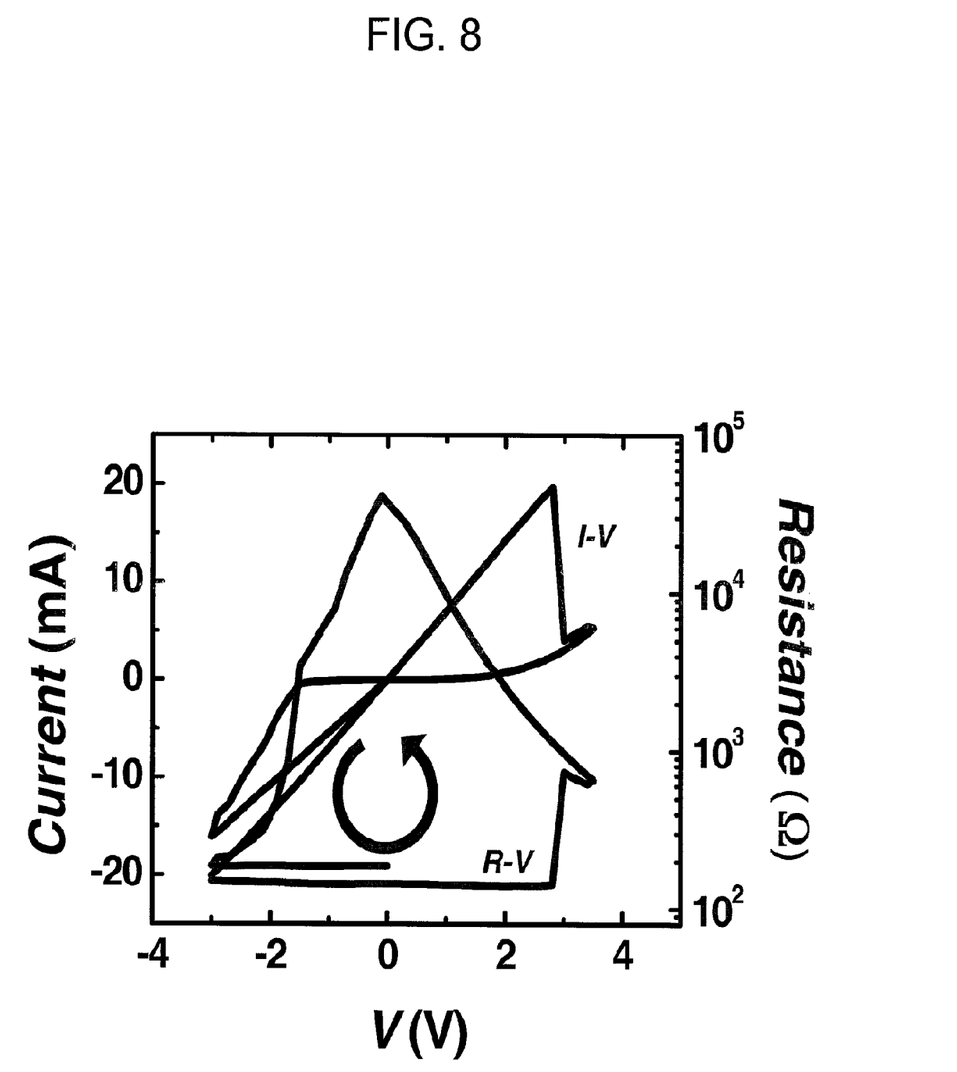
FIG. 8 depicts the typical I-V and R-V curves of one embodiment of the present invention using an amorphous $SiN_{4/3}$—Pt mixture.

Current-voltage (R-V) curves were also measured for a device using single crystal silicon p-type silicon with 100 orientation as the substrate, $SrRuO_3$ as the bottom electrode, Pt as the top electrode, and $SiN_{4/3}$/Pt as the amorphous mixture layer. The mixture layer was deposited on the substrate, heated to 300° C., using RF-sputtering. The test cells in the current device had a diameter of 80 μm. A typical room temperature I-V curve is shown in FIG. 8 for a voltage sweep of 0 V to −3 V to 0 V to 3.5 V to 0 V to −3 V to 0 V. The mixture shows a low initial resistance ~200 Ω and this low resistance state is stable under a negative bias. Under a positive bias, it is still stable below 2.5 V, but the resistance suddenly increases to a larger value around approximately 40 kΩ when the bias exceeded 3 V. The high resistance state is kept until a negative bias of from about −1.5 to −2.5 V is applied, which switches the resistance back to the low resistance state. Except for the lower values of set voltages, the characteristics of this device are the same as those of the Pt/SiO$_2$—Pt/SrRuO$_3$ devices described above.

Figure 9A:
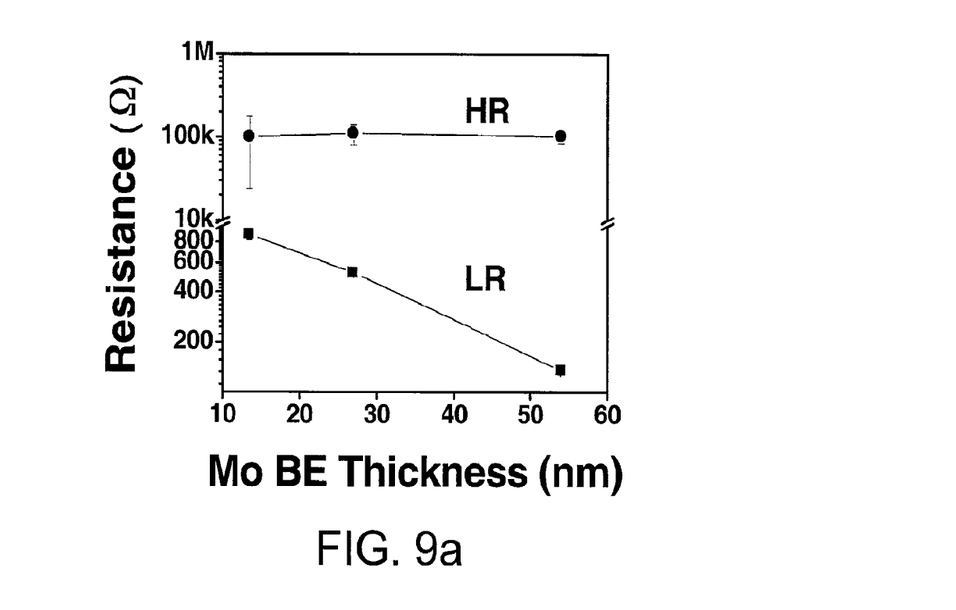
Figure 9B:
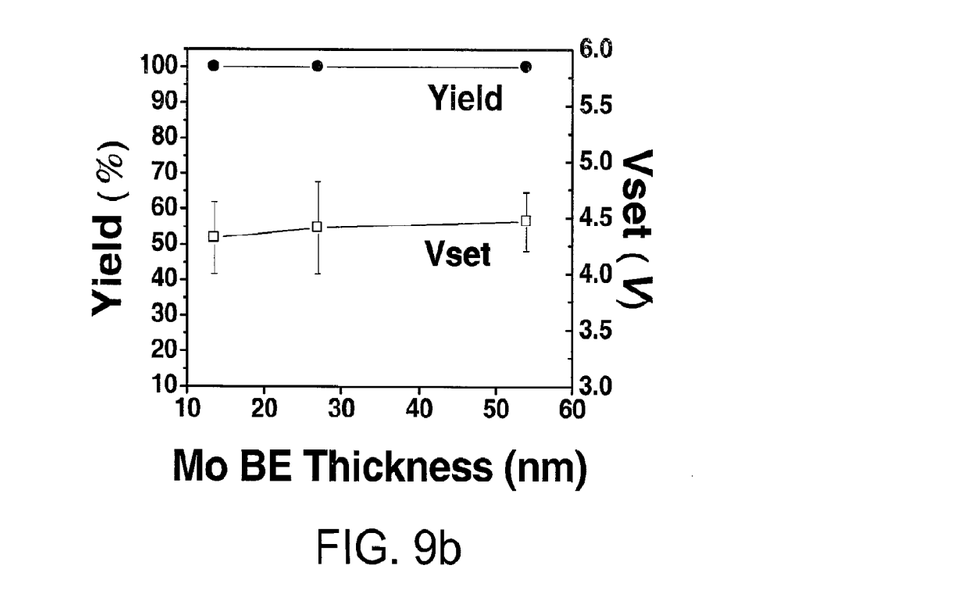

As another example, devices on single crystal p-type silicon using SiO$_2$/Pt as amorphous mixture layer and Pt as the top electrode, but polycrystalline Mo as the bottom electrode, were also fabricated. The Mo bottom electrode was deposited by DC or RF magnetron sputtering with an argon pressure of 5 mtorr in a sputtering chamber with a base pressure <1×10$^{-6}$ torr. The test cells had a diameter of 80 μm. These devices have the same characteristics as the ones described previously, including the dependence of electrical characteristics on thickness of the mixture layer similar to those shown in FIGS. 6(a)-(d), and the electrical switching behavior as a function of SiO$_2$/Pt thickness and Pt concentration similar to those shown in FIG. 4. As shown in FIG. 9, when the thickness of Mo bottom electrode increases, the resistance value of the low resistance state decreases but the resistance of the high resistance state remains constant (FIG. 9(a)), as do yield and set voltage (FIG. 9(b)). Therefore, a significant portion of the resistance value of the low resistance is attributed to the bottom electrode, and this contribution, as well as the ratio of the high resistance value to the low resistance value, can be varied by varying the bottom electrode characteristics.

As an additional example, UV reset tests were performed. In such an example, a device on transparent fused quartz using SiO$_2$/Pt as amorphous mixture layer and Pt as the top electrode, but polycrystalline Mo as the bottom electrode, was fabricated. The electrical characteristics of this device are similar to those described above. The device was first switched to the high resistance state using a set voltage, then read using a reading pulse of 0.2 V once every second for 20 seconds, which indicated the same resistance value independent of time verifying that the device was in a stable state. An UV light source (ELC-403, Electro-Lite Corp., Bethel, Conn.) having an output wavelength of 300-420 nm corresponding to an output photon energy of 4.2-3.0 eV was next turned on to irradiate the device from below the quartz substrate. As shown in FIG. 10, after UV was turned on, the device promptly switched to the low resistance state. Since UV irradiation generates only photoelectrons but no electrical voltage, it only stimulates electron movement but not ion or atom movement. Therefore, this example illustrated that resistance switching in the present device requires only electron movement but not ion or atom movement. Not requiring the slower movement of ions or atoms, such a device has an intrinsically faster switching speed.

What is claimed:

1. A resistive device, comprising:
    an amorphous layer region that includes
        an admixture composition of
        an electrically conducting composition, and
        an electrically insulating silicon-containing composition;
        the electrically conducting composition comprising from about 5 percent to about 40 percent by molar percentage of the moles of electrically conducting composition and electrically insulating silicon-containing composition in the admixture composition,
        wherein the electrically conducting composition comprises a metal M, wherein M comprises Pt, Pd, Ni, W, Au, Ag, Cu, Al, Rh, Re, Ir, Os, Ru, Nb, a conducting metal (Me) nitride, MeN$_x$, a conducting metal (Me) silicide, MeSi$_x$, or any combination thereof, wherein x is in the range of from about 0.5 to about 3;
        the electrically insulating silicon-containing composition comprises a silicon-containing species SiO$_w$N$_y$, wherein w is in the range of from 0 to about 2 and y is in the range of from 0 to about 4/3; and
        wherein the molar percentage of the electrically conducting composition is defined as (%M+%Me)/(%M+%Me+%Si)×100%, wherein Si is from the electrically insulating silicon-containing composition, and
    at least two electrodes in electrical contact with the amorphous layer region.

2. The resistive device of claim 1, wherein the distance between the at least two electrodes is from about 4 to about 60 nanometers.

3. The resistive device of claim 1, comprising a plurality of said amorphous layer regions.

4. The resistive device of claim 1, wherein the electrically conducting composition comprises Pt.

5. The resistive device of claim 1, wherein the conducting metal nitride comprises TiN, ZrN, HfN, NbN, TaN, or any combination thereof.

6. The resistive device of claim 1, wherein the conducting metal silicide comprises PtSi$_2$, TiSi$_2$, CoSi$_2$, NiSi$_2$, NbSi$_2$, TaSi$_2$, MoSi$_2$ or WSi$_2$, or any combination thereof.

7. The resistive device of claim 1, wherein the electrically insulating silicon-containing composition comprises B or P doped silicon oxide.

8. The resistive device of claim 1, wherein the electrically conducting composition comprises from about 6 percent to about 35 percent by molar percentage of the moles of electrically conducting composition and electrically insulating silicon-containing composition in the admixture composition.

9. The resistive device of claim 1, wherein the electrically conducting composition comprises from about 7 percent to about 30 percent by molar percentage of the moles of electrically conducting composition and electrically insulating silicon-containing composition in the admixture composition.

10. The resistive device of claim 1, wherein the electrically conducting composition comprises from about 8 percent to about 25 percent by molar percentage of the moles of electrically conducting composition and electrically insulating silicon-containing composition in the admixture composition.

11. The resistive device of claim 1, wherein the amorphous layer region comprises less than five percent crystallites of the electrically conducting composition by weight of the moles of electrically conducting composition and electrically insulating silicon-containing composition in the admixture composition.

12. The resistive device of claim 1, wherein the distance between the at least two electrodes is from about 5 to about 50 nanometers.

13. The resistive device of claim 1, wherein the distance between the at least two electrodes is from about 6 to about 45 nanometers.

14. The resistive device of claim 1, wherein the distance between the at least two electrodes is from about 7 to about 35 nanometers.

15. The resistive device of claim 1, wherein the distance between the at least two electrodes is from about 8 to about 30 nanometers.

16. A circuit comprising a plurality of resistive devices, each one of which resistive devices comprises:
   at least one amorphous layer, each amorphous layer comprising:
      an admixture composition comprising
         a composition comprising an electrically conducting composition, and
         an electrically insulating silicon-containing composition;
      the electrically conducting composition comprising from about 5 percent to about 40 percent by molar percentage of the moles of electrically conducting composition and electrically insulating silicon-containing composition in the admixture composition,
      wherein the electrically conducting composition comprises a metal M, wherein M comprises Pt, Pd, Ni, W, Au, Ag, Cu, Al, Rh, Re, Ir, Os, Ru, Nb, a conducting metal (Me) nitride, $MeN_x$, a conducting metal (Me) silicide, $MeSi_x$, or any combination thereof, wherein x is in the range of from about 0.5 to about 3;
      the electrically insulating silicon-containing composition comprises a silicon-containing species $SiO_wN_y$, wherein w is in the range of from 0 to about 2, and y is in the range of from about 0 to about 4/3; and
      wherein the molar percentage of the electrically conducting composition is defined as (%M+%Me)/(%M+%Me+%Si) x 100%, wherein Si is from the electrically insulating silicon-containing composition. and
   at least two electrodes capable of being in electrical contact with a current source and with the amorphous layer.

17. The circuit of claim 16, wherein the distance between the at least two electrodes is from about 4 to about 60 nanometers.

18. The circuit of claim 16, comprising a plurality of said amorphous layers.

19. The circuit of claim 16, wherein the electrically conducting composition is Pt.

20. The circuit of claim 16, wherein the conducting metal nitride comprises TiN, ZrN, HfN, NbN or TaN.

21. The circuit of claim 16, wherein the conducting metal silicide comprises $PtSi_2$, $TiSi_2$, $CoSi_2$, $NiSi_2$, $NbSi_2$, $TaSi_2$, $MoSi_2$ or $WSi_2$, or any combination thereof.

22. The circuit of claim 16, wherein the electrically insulating silicon-containing composition comprises B or P doped silicon oxide.

23. The circuit of claim 16, wherein the electrically conducting composition comprises from about 6 percent to about 35 percent by molar percentage of the moles of electrically conducting composition and electrically insulating silicon-containing composition in the admixture composition.

24. The circuit of claim 16, wherein the electrically conducting composition comprises from about 7 percent to about 30 percent by molar percentage of the moles of electrically conducting composition and electrically insulating silicon-containing composition in the admixture composition.

25. The circuit of claim 16, wherein the electrically conducting composition comprises from about 8 percent to about 25 percent by molar percentage of the moles of electrically conducting composition and electrically insulating silicon-containing composition in the admixture composition.

26. The circuit of claim 16, wherein the amorphous layer comprises less than five percent crystallites of the electrically conducting composition by weight of the moles of electrically conducting composition and electrically insulating silicon-containing composition in the admixture composition.

27. The circuit of claim 16, wherein the distance between the at least two electrodes is from about 5 to about 50 nanometers.

28. The circuit of claim 16, wherein the distance between the at least two electrodes is from about 6 to about 45 nanometers.

29. The circuit of claim 16, wherein the distance between the at least two electrodes is from about 7 to about 35 nanometers.

30. The circuit of claim 16, wherein the distance between the at least two electrodes is from about 8 to about 30 nanometers.

31. A memory device comprising one or more circuits, each circuit comprising:
   at least one amorphous layer, the amorphous layer comprising
      an admixture composition comprising
         an electrically conducting composition, and
         an electrically insulating silicon-containing composition;
      the electrically conducting composition comprising from about 5 percent to about 40 percent by molar percentage of the moles of electrically conducting composition and electrically insulating silicon-containing composition in the admixture composition,
      wherein the electrically conducting composition comprises a metal M, wherein M comprises Pt, Pd, Ni, W, Au, Ag, Cu, Al, Rh, Re, Ir, Os, Ru, Nb, a conducting metal (Me) nitride, $MeN_x$ a conducting metal (Me) silicide, $MeSi_x$, or any combination thereof, wherein x is in the range of from about 0.5 to about 3;
      the electrically insulating silicon-containing composition comprises a silicon-containing species $SiO_wN_y$, wherein w is in the range of from 0 to about 2, and y is in the range of from about 0 to about 4/3; and
      wherein the molar percentage of the electrically conducting composition is defined as (%M+%Me)/(%M+%Me+%Si)x100%, wherein Si is from the electrically insulating silicon-containing composition,
   and at least two electrodes in electrical contact with the amorphous layer.

32. The memory device of claim 31, wherein the distance between the at least two electrodes is from about 4 to about 60 nanometers.

33. The memory device of claim 31, comprising a plurality of said amorphous layers.

34. The circuit of claim 31, wherein the electrically conducting composition is Pt.

35. The memory device of claim 31, wherein the conducting metal nitride comprises TiN, ZrN, HfN, NbN or TaN.

36. The memory device of claim 31, wherein the conducting metal silicide comprises $PtSi_2$, $TiSi_2$, $CoSi_2$, $NiSi_2$, $NbSi_2$, $TaSi_2$, $MoSi_2$ or $WSi_2$, or any combination thereof.

37. The memory device of claim 31, wherein the electrically insulating silicon-containing composition comprises B or P doped silicon oxide.

38. The memory device of claim 31, wherein the electrically conducting composition comprises from about 6 percent to about 35 percent by molar percentage of the moles of electrically conducting composition and electrically insulating silicon-containing composition in the admixture composition.

39. The memory device of claim 31, wherein the electrically conducting composition comprises from about 7 percent to about 30 percent by molar percentage of the moles of electrically conducting composition and electrically insulating silicon-containing composition in the admixture composition.

40. The memory device of claim 31, wherein the electrically conducting composition comprises from about 8 percent to about 25 percent by molar percentage of the moles of electrically conducting composition and electrically insulating silicon-containing composition in the admixture composition.

41. The memory device of claim 31, wherein the amorphous layer comprises less than five percent crystallites of the electrically conducting composition by weight of the moles of electrically conducting composition and electrically insulating silicon-containing composition in the admixture composition.

42. The memory device of claim 31, wherein the distance between the at least two electrodes is from about 5 to about 50 nanometers.

43. The memory device of claim 31, wherein the distance between the at least two electrodes is from about 6 to about 45 nanometers.

44. The memory device of claim 31, wherein the distance between the at least two electrodes is from about 7 to about 35 nanometers.

45. The memory device of claim 31, wherein the distance between the at least two electrodes is from about 8 to about 30 nanometers.

* * * * *

UNITED STATES PATENT AND TRADEMARK OFFICE
CERTIFICATE OF CORRECTION

PATENT NO. : 9,236,118 B2
APPLICATION NO. : 13/060514
DATED : January 12, 2016
INVENTOR(S) : I-Wei Chen et al.

Page 1 of 1

It is certified that error appears in the above-identified patent and that said Letters Patent is hereby corrected as shown below:

Specification

Column 1,
Lines 16-20, delete "At least a portion of the work leading to the disclosed inventions was made using federal support by the National Science Foundation under grants number DMR07-05054 and DMR-05-20020. Accordingly, the U.S. government may have rights to the disclosed inventions." and insert -- This invention was made with government support under grant numbers DMR0705054 and DMR0520020 awarded by the National Science Foundation. The government has certain rights in the invention. --.

Claims

Column 14,
Claim 31, lines 39-40, delete "(%M+%Me)/(%M+%Me+%Si)x100%," and insert -- (%M+%Me)/(%M+%Me+%Si) x 100%, --.

Claim 31, line 42, after "and" insert -- , --.

Signed and Sealed this
Seventh Day of June, 2016

Michelle K. Lee
*Director of the United States Patent and Trademark Office*